United States Patent [19]

Sato

[11] Patent Number: 5,766,999
[45] Date of Patent: Jun. 16, 1998

[54] METHOD FOR MAKING SELF-ALIGNED BIPOLAR TRANSISTOR

[75] Inventor: Fumihiko Sato, Tokyo, Japan

[73] Assignee: NEC Corporation, Tokyo, Japan

[21] Appl. No.: 623,573

[22] Filed: Mar. 28, 1996

[30] Foreign Application Priority Data

Mar. 28, 1995 [JP] Japan .................... 7-069520

[51] Int. Cl.$^6$ ........................... H01L 21/331
[52] U.S. Cl. .................. 438/309; 438/341; 438/933; 257/198; 257/591; 257/592; 257/593
[58] Field of Search ................ 148/DIG. 10, 11; 257/197, 198, 591, 592, 593; 438/309, 341, 933

[56] References Cited

U.S. PATENT DOCUMENTS

| | | |
|---|---|---|
| 5,296,391 | 3/1994 | Sato et al. ................ 437/31 |
| 5,321,301 | 6/1994 | Sato et al. ................ 257/592 |
| 5,323,032 | 6/1994 | Sato et al. ................ 257/198 |
| 5,424,228 | 6/1995 | Imai ........................ 437/31 |
| 5,432,104 | 7/1995 | Sato ........................ 437/31 |
| 5,484,737 | 1/1996 | Ryum et al. ............... 437/31 |
| 5,494,836 | 2/1996 | Imai ........................ 437/31 |
| 5,504,018 | 4/1996 | Sato ........................ 437/31 |

FOREIGN PATENT DOCUMENTS

| | | |
|---|---|---|
| 62-25924 | 2/1988 | Japan . |
| 6-168952 | 6/1994 | Japan . |

OTHER PUBLICATIONS

People et al., "Calculation Of Critical Layer Thickness Versus Lattice Mismatch For $Ge_xSi_{1-x}/Si$ Strained–layer Heterostructures", *Appl. Phys. Lett.*, vol. 47(3):322–324, (1985).

Sato et al., "A Super–Aligned Selectively Grown SiGe Base (SSSB) Bipolar Transistor Fabricated By Cold–Wall Type UHV/CVD Technology", *IEEE Transactions on Electron Devices*, vol. 41(8):1373–1378, (1994).

*Primary Examiner*—John Niebling
*Assistant Examiner*—Long Pham
*Attorney, Agent, or Firm*—Foley & Lardner

[57] ABSTRACT

A SiGe alloy film containing electrically active impurity in a concentration higher than the intrinsic base layer is formed on the eaves-structured polycrystalline silicon film for base electrode. After that, SiGe only just under the opening is removed completely by dry etching under a condition that etching speed of SiGe is faster than that of Si, and subsequently the intrinsic base layer is formed.

10 Claims, 9 Drawing Sheets

METHOD FOR MAKING SELF-ALIGNED BIPOLAR TRANSISTOR

BACKGROUND OF THE INVENTION

The present invention relates to a semiconductor device and a method for manufacturing the semiconductor device and more particularly to a bipolar transistor and a method for manufacturing the same. It is widely known that a bipolar transistor having a thinner base gives high cut-off frequency $f_T$, which suggests the high-speed performance. Also it is widely known that the reduction of base fetch resistance is favorable to high speed operation of a transistor. The manufacturing process in prior art for manufacturing a bipolar transistor with high speed operation performance and in which a self-aligned base and emitter layers are formed is described briefly herein under. First, an n-type collector layer is formed on a semiconductor substrate. Then an insulating film provided with an opening for exposing the collector layer is formed on the semiconductor substrate. A base electrode, one end of which electrode projects to the opening, is formed on the insulating film. Next, the p-type first and second semiconductor layers are grown respectively on the collector layer in the opening and on the bottom surface of the end of the base electrode which is projecting to the opening to form an electrical junction between the collector and electrode. Then, the first semiconductor layer is removed selectively to expose the collector layer. The residual first and second semiconductor layers are served as outer base layers by the removal. A p-type inner base layer is formed on the exposed collector layer, and, an n-type emitter layer is formed on the inner base layer. The major portion of a conventional bipolar transistor is manufactured as described herein above.

In manufacturing of the bipolar transistor, the inner and outer base layers are formed by growing separately. The separate formation results in reduced base fetch resistance by forming the outer base layer of the first and second semiconductor layers with high impurity concentration, and also results in a thinned inner base layer which is thinner than the outer base layer. Thereby, a self-aligned bipolar transistor with high speed performance is obtained.

However, it has been revealed that there is room for improvement in this conventional bipolar transistor. After forming of the first semiconductor layer, the first semiconductor layer is removed selectively to expose the surface of the collector layer. In the removing process, it is required that the first semiconductor layer on the area where an inner base layer will be formed afterward should be removed completely while the surface of the collector layer is prevented from removing. Because if the first semiconductor layer remains residually in the inner base region, the residual first semiconductor layer serves actually as a base layer. Therefore, even if a thin inner base layer is formed afterward, a thick base region comprising the residual first semiconductor layer and the thin inner base layer is formed inevitably. If the surface of the collector layer becomes removed excessively, the distance between the base electrode and the inner base layer which will be formed on the collector is too long, the longer distance results in increased base resistance. Such thick base region and high base resistance is disadvantageous for high speed operation of a bipolar transistor.

SUMMARY OF THE INVENTION

It is the object of the present invention to provide a bipolar transistor capable of further high speed operation and a method for manufacturing the bipolar transistor.

A semiconductor device in accordance with the present invention is provided with a first-conductive type collector formed on a semiconductor substrate, an insulating film being formed on the semiconductor substrate and having an opening for exposing the collector layer, a base electrode formed on the insulating film projecting to the opening area at one end thereof, the second-conductive type first semiconductor layer covering the periphery of the collector layer in the opening, exposing the central area of the collector layer, having a composition different from that of the collector, and extending to the base electrode, the second semiconductor layer of second conductive type being formed on the one end of the base electrode extending to the opening area, and extending from the one end of the base electrode to the first semiconductor layer to connect electrically with the first semiconductor layer, and a second-conductive type inner base layer being formed on the central area of the collector layer, and a first-conductive type emitter layer being formed on the inner base layer.

The method for manufacturing a semiconductor device in accordance with the present invention comprises the step of forming a first-conductive type collector layer on a semiconductor substrate, forming an insulating layer having an opening for exposing the collector layer on the semiconductor substrate, forming a base electrode projecting to the opening area at one end thereof on the insulating layer, growing the first and second semiconductor layers of second conductive type on the one end of the base electrode projecting above the collector in the opening area and to the opening area to connect electrically, removing selectively the first semiconductor layer to expose the collector layer using an etchant having a higher etching rate to the first semiconductor layer than to the collector layer so that the residual first and second semiconductor layers are served as an outer base layer, forming a second-conductive type inner base layer on the exposed collector layer, and forming a first-conductive type emitter layer on the inner base layer.

According to the constitution described herein above, the first semiconductor layer does not remain residually on the area where an inner base layer will be formed, and the constitution therefore allows not only the base layer to be effectively thin but also the surface of the collector layer to be prevented from removing. the distance between the inner base layer and base electrode is short. Accordingly, the base resistance is reduced. Accordingly, a bipolar transistor with further higher speed operation performance is realized.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1A:
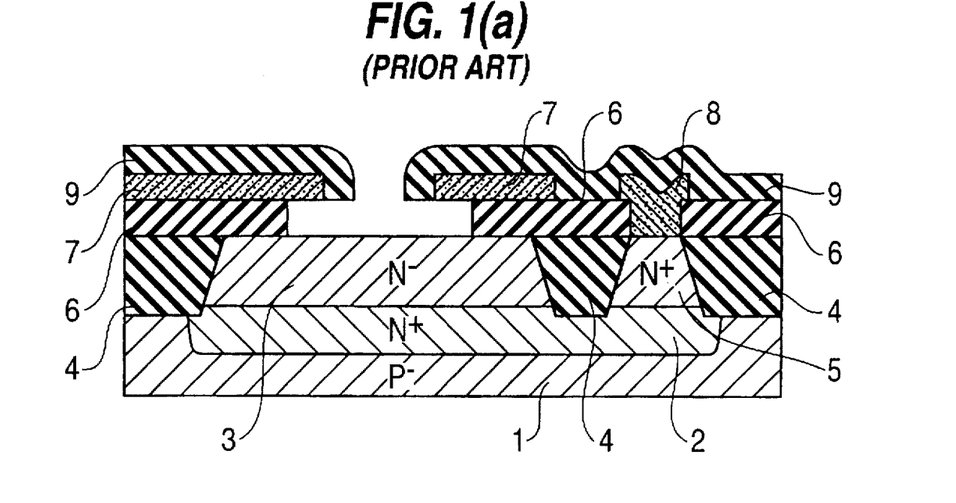
FIG. 1(a) to FIG. 1(e) are a set of cross-sectional views for illustrating the order of manufacturing steps for description of the prior art.

Before embodiments of the present invention is described, prior arts will be described in detail referring to the drawings. The first prior art is described referring to Japanese Laid-Open Patent No. Hei 6-168952. As shown in FIG. 1(a), $N^+$-type buried layer 2 and $N^-$-type silicon epitaxial layer 3 which are placed one above the other on $P^-$-type silicon substrate 1, and LOCOS oxide film 4 for separation of element and $N^+$-type collector fetch region 5 are provided. A $P^+$-type polycrystalline silicon film 7 for base electrode is formed on the silicon oxide film 6, a polycrystalline silicon 8 for $N^+$-type collector electrode is formed on the collector fetch region 5.

The polycrystalline silicon film 8 for collector electrode and polycrystalline silicon film 7 for base electrode are covered with silicon nitride films 9 individually. The bottom surface of the polycrystalline silicon film 7 for base electrode is exposed partially facing to the top surface of the $N^-$-type epitaxial layer 3. The manufacturing process of the structure is described in detail in the Japanese Laid-Open Patent No. Hei 6-168952.

Figure 1B:
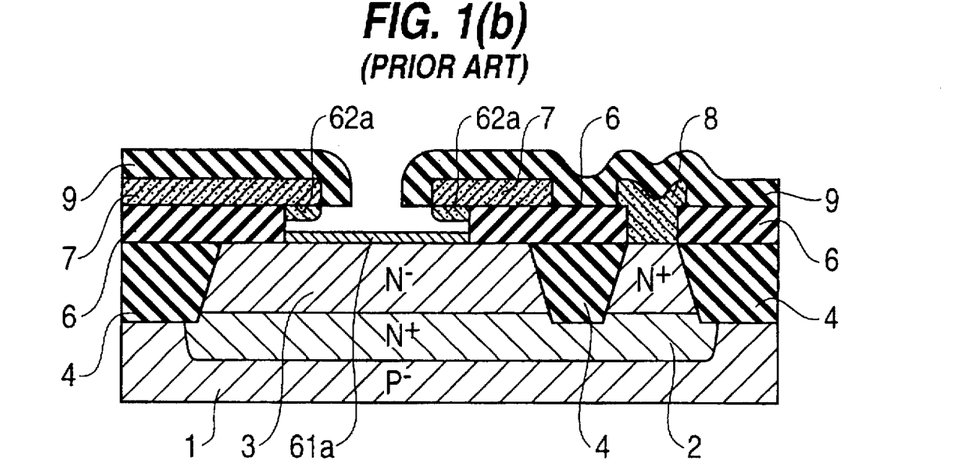

Then, as shown in FIG. 1(b), a silicon film doped with boron in high concentration is grown by selective epitaxial growing method. The selective growing means a type of growing that nothing is grown on the insulating film and a silicon film is grown only on a single-crystalline and polycrystalline silicon film. In this case, $P^{++}$-type polycrystalline silicon film 62a is grown on the bottom surface of the polycrystalline silicon film 7 for base electrode, and simultaneously, $P^{++}$-type single-crystalline silicon film 61a is formed on the $N^-$-type epitaxial layer 3.

Figure 1C:
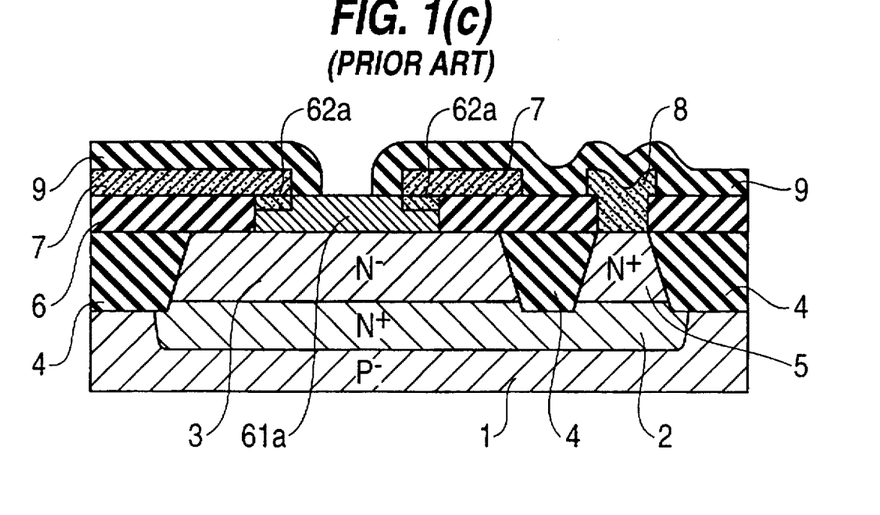

As shown in FIG. 1(c), as the selective epitaxial growth continues, $P^{++}$-type single crystalline silicon film 61a and $P^{++}$-type polycrystalline silicon film 62a continue to grow and are connected each other.

Figure 1D:
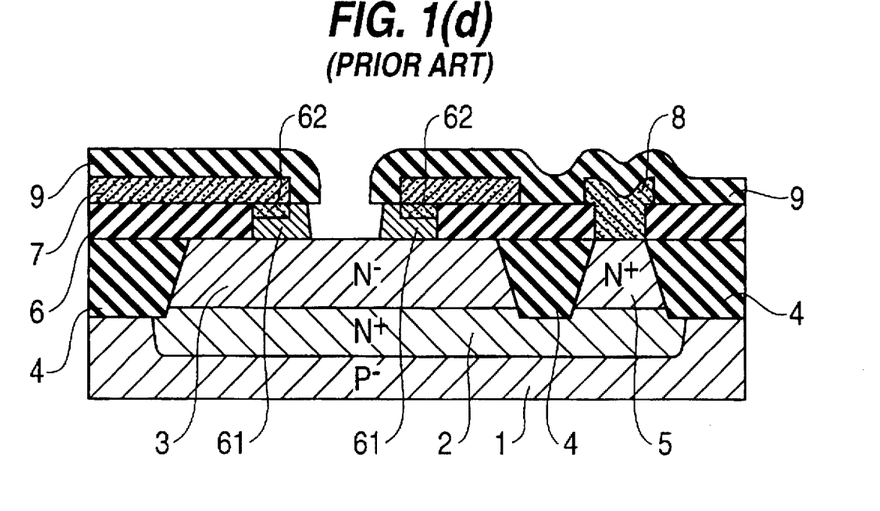

Then, as shown in FIG. 1(d), the $P^{++}$type single crystal silicon film 61a on the area just under the opening formed in the silicon nitride film 9 is removed. Then, $P^{++}$-type polycrystalline silicon film 62 is left as a residual layer on the bottom surface of the polycrystalline silicon film 7 for base electrode, and a part of $P^{++}$-type single crystal silicon film 61 is removed with leaving a residual layer on the epitaxial layer 3. For the removal of the silicon film 61a, anisotropic etching is preferably used. To eliminate a damaged area due to etching, it is preferable that the etched surface is oxidized and the oxide film is removed by wet-etching.

Figure 1E:
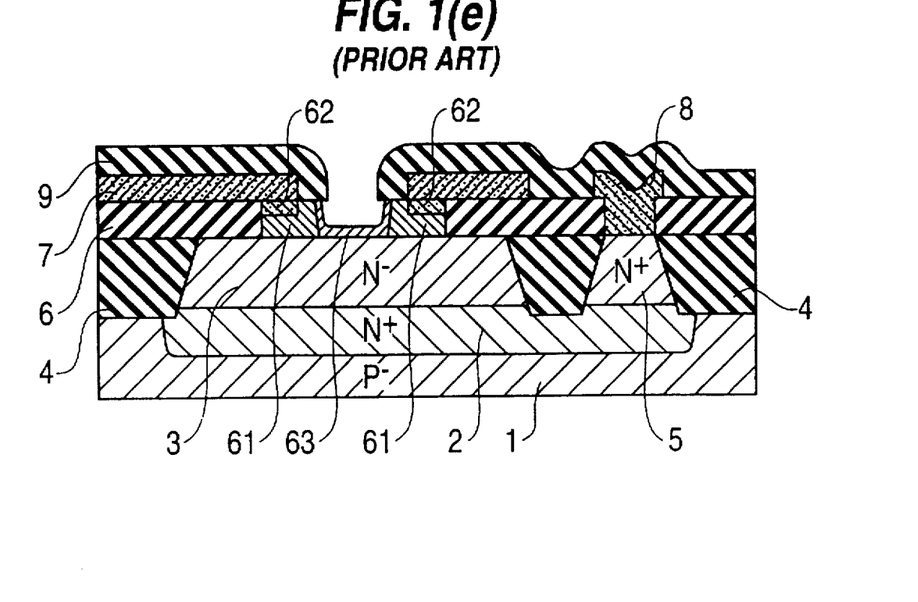

Then, as shown in FIG. 1(e), an intrinsic base layer 63 is formed by selective epitaxial growing method on the area of the epitaxial layer 3 where the $P^{++}$-type single crystal silicon film has been removed. Then, an emitter region not shown in the figures is formed, and a bipolar transistor is thus completed. In this bipolar transistor, the sheet resistance of the base link region is reduced to the level lower than that of the intrinsic base layer 63, and the bipolar transistor is therefore excellent in high speed operation performance.

However, according to the first prior art, the technique is involved in the problem described herein under. In the technique, it is required that $p^{++}$-type single crystal silicon film 61a is partially etched so that $p^{++}$-type polycrystalline silicon layer 62 and $p^{++}$-type single crystal silicon film 61 are removed while leaving a residual layer only in the area under the bottom surface of the poly-silicon film 7 for base electrode. Moreover, it is required that $p^{++}$-type single crystal silicon film 61a is removed completely without any residual film on the area of the epitaxial layer 3 just under the opening. Furthermore, it is required that the intrinsic base 63 is formed so that the top surface of $n^-$-type epitaxial layer 3 is removed as scarcely as possible. The reason is described herein under. If a part of the $p^{++}$-type single crystal silicon film 61a remains residually on the epitaxial layer 3 just under the opening after etching, the residual $p^{++}$-type single crystal silicon film 61a serves actually as a base layer. Therefore, though thin intrinsic base layer 63 is formed afterward, a thick base comprising the residual $p^{++}$-type single crystal silicon film and the intrinsic base layer 63 is formed. To the contrary, if the surface of the $n^-$-type epitaxial layer 3 is removed excessively by etching, the distance between the intrinsic base layer 63 formed on the surface of the epitaxial layer 3 and $p^+$-type polycrystalline silicon film 7 become longer. The longer distance results in increased base resistance. As described herein above, it is desirable for the ideal etching of $P^{++}$-type single crystal silicon layer 61a that etching is brought to a stop at the interface between the $n^-$-type epitaxial layer 3 and the $P^{++}$-type single crystal silicon layer 61a. However, for actual etching of silicon film, it is impossible to increase the selective ratio of etching by utilizing concentration difference of electrically active impurity. In reality, the technique results in transistor products including transistors which have a base layer different in effective thickness in the wafer and which have different base resistances.

The second prior art is described referring to Japanese Laid-Open Patent No. Sho 63-25924, which discloses selective etching technique of Ge. In this technique, $GeCl_4$ or a gas containing $GeCl_4$ is used as etching gas and a substrate is heated, thereby, Ge layer is vapor phase-etched selectively. To apply this technique to the manufacturing process of transistors in the context of the present invention, it may possible to leave a residue only under the bottom surface of the polycrystalline silicon film 7 for base electrode with overhang structure by a method in which a Ge layer is selectively grown on the polycrystalline silicon film 7 for base electrode having overhang structure as shown in FIG. 1, subsequently, the substrate is heated and a $GeCl_4$-based etching gas is used. More favorably for the etching, Ge and Si are etched differently, and $n^-$-type epitaxial silicon layer 3 is therefore scarcely removed and no Ge will remain on the $n^-$-type epitaxial layer 3 just under the opening throughout the area on the wafer after completion of the etching. As described above, this technique realizes the ideal structure as the preliminary structure for forming the intrinsic base layer 63.

However, the manufacturing method of a semiconductor device disclosed in the Japanese Laid-Open Patent No. Sho 63-25924 is involved in the following problem. Ge and Si are greatly different in lattice constant. In detail, the lattice constant of Ge ($a_{Ge}$)=5.65 Å and the lattice constant of Si ($a_{Si}$)=5.43 Å. The difference in lattice constant is too large for forming a base-collector junction without generating defects.

In the literature, R. People et al. "Calculation of critical layer thickness versus lattice mismatch for $Ge_xSi_{1-x}$/Si strained-layer heterostructures", Appl. Phys. Lett., Vol. 47 (1985), p. 322, it is suggested that the maximum thickness of Ge which can grow without generating dislocation is only around 10 Å.

Based on the result reported as described herein above, if the distance between the n⁻-type epitaxial layer 3 for collector and the polycrystalline silicon film 7 for base electrode is designed as the same distance as used conventionally, a Ge layer formed under the bottom surface of the polycrystalline silicon film 7 for base electrode having overhang structure will become a crystal containing dislocations. The inclusion of dislocation means inclusion of defects between collector-base junctions, and the inclusion of defect causes leak current between junctions. The distance between the polycrystalline silicon film 7 for base electrode and n⁻-type epitaxial layer 3 for collector cannot therefore be designed to the same distance as the conventional usual thickness.

If the distance between the polycrystalline silicon film 7 for base electrode and the n⁻-type epitaxial layer 3 for collector is designed to be small comparing to the conventional art, the capacitance between the both junctions is increased.

It is the problem of the second prior art that base resistance can not be reduced while parasitic capacitance is suppressed at a low level.

Turning to the FIG. 2 to FIG. 6, embodiments of the present invention will be described in detail.

The present invention is described referring to n-p-n type bipolar transistor, but as a matter of course, the present invention can be applied also to p-n-p type bipolar transistor.

Figure 2:
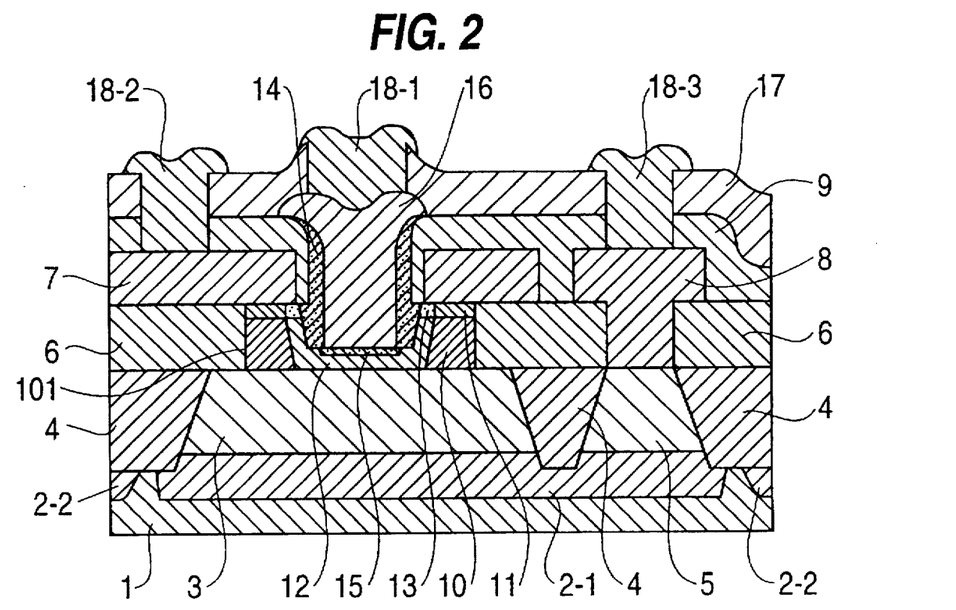
FIG. 2 is a cross-sectional view for illustrating a semiconductor device of the first embodiment in accordance with the present invention.

In FIG. 2, the semiconductor device in accordance with the present invention comprises the first semiconductor region 3, an interlayer insulation film 6, the second semiconductor region 10 and 11, the third semiconductor regions 12 and 13, a side wall insulating film 14, and the fourth semiconductor region 15 as the basic structure, the first semiconductor region 3 is surrounded by the insulating film 4 to form an island-like structure.

The interlayer insulating film 6 is formed on the first semiconductor region 3 and has an opening 101 extending to the first semiconductor region 3, the second semiconductor region 10 and 11 has the approximately the same film thickness as the interlayer insulating film 6, and covers the side wall of the opening 101 of the interlayer insulating film 6, the third semiconductor region 12 and 13 consists of semiconductor material containing lower impurity concentration than that of the second semiconductor region 10 and 11, has the thinner thickness than the interlayer insulating film 6, and covers the top surface of the first semiconductor region and the side surface of the second semiconductor region 10 and 11, the side wall insulating film 14 is formed covering the side surface of the third semiconductor region 12 and 13, and the fourth semiconductor region 15 is formed in contact with the third semiconductor region surrounded by the side wall insulating film.

The second semiconductor region 10 and 11 may be made of a semiconductor material with a high impurity concentration different from the first semiconductor region 3 in the concentration.

The second semiconductor region 10 and 11 can be comprises a laminated structure of four components, namely, the semiconductor material 10 different from that of the first semiconductor region 3, semiconductor material 31 and 32 with the same quality as the first semiconductor region, and the semiconductor material 11 different from that of the first semiconductor region. Silicon (Si) material is assigned to the first semiconductor material, and silicon germanium (SiGe) alloy is assigned to the material different from the first semiconductor material. The lattice constant of the both materials is different each other, therefore, it is difficult to form a thick layer of SiGe on Si without generating defects. However, the laminated structure of the second semiconductor region of silicon germanium/silicon/silicon germanium (SiGe/Si/SiGe) allows the layer to grow thicker. As the result, it is possible to design the interlayer insulating film to be thick, and the parasitic capacitance between the polycrystalline silicon film for base electrode and a collector region is reduced.

In the second semiconductor region 10 and 11, the property of material in the area in contact with the first semiconductor region 3 may be different from the property of material of the first semiconductor region, the difference in the property may be more definite at the portion of the second semiconductor region nearer to the first semiconductor region. This gradual property is described referring to the above-mentioned materials. In the SiGe region of the second semiconductor region, Ge content is highest at the boundary between the first and second semiconductor regions, and in the vertical direction in the second semiconductor, Ge content at some position decreases as the position is farther from the boundary. Therefore, etching at the interface between the first and second semiconductor conductor regions is highly selective, and the wider space between the polycrystalline silicon film and collector than that of the above-mentioned arrangement is realized, thus, the parasitic capacitance therebetween is reduced.

Band gap of the third semiconductor region 12 and 13 is narrower than those of the first semiconductor region 3 and fourth semiconductor region 15. Thereby, the higher current amplification factor $h_{FE}$ is realized.

The band gap of the third semiconductor region 12 and 13 may be gradually wider as the position is farther from the first semiconductor region 3, and semiconductor material of the second semiconductor region 10 and 11 consists of SiGe alloy. Therefore, an electric field which accelerates the running of minority carrier passing through the base region is generated, the electric field results in the shortened base running time, and the high speed operation is realized.

In the third semiconductor region 12 and 13, the concentration of electrically active impurity may be low at the area in contact with the first and fourth semiconductor regions 3 and 15.

The detail is described referring to an embodiment herein under. In FIG. 2, n⁺-type buried layer 2-1 and p⁺-type buried layer 2-2 are formed on the surface of the p⁻-type silicon substrate 1, and on the surface of these layers the n⁻-type epitaxial layer 3 is formed as the first semiconductor region. The epitaxial layer 3 is to be served as a collector region of the bipolar transistor.

The epitaxial layer 3 is partitioned by a selective oxide film 4 according to the usual LOCOS oxidation technique. The oxide film 4 extends to the buried layers 2-1 and 2-2. A partial area of the epitaxial layer of the whole epitaxial layer 3 which is not served as collector region of the transistor is doped with high concentration impurity, and the partial area is served as n⁺-type collector leading region 5.

On the surface of the epitaxial layer 3 and collector leading region 5, a silicon oxide film 6, which is served as an interlayer insulating film, is formed, and on the partial surface area of the silicon oxide film 6, a polycrystalline silicon film 7 for p⁺⁺-type base electrode and a polycrystalline silicon film 8 for a collector electrode which is in contact with the collector leading region 5 are formed. These polycrystalline silicon films 7 and 8 are covered with a silicon nitride film 9.

In a overhang portion structured by the polycrystalline silicon film 7 for the base electrode, the silicon oxide film 6, and the n⁻-type epitaxial layer 3, the p⁺-type single crystal SiGe alloy film 10 and the p⁺-type polycrystalline SiGe alloy film 11 are laminated to form the second semiconductor region. A p⁺-type silicon intrinsic base layer 12 is in contact with the surface of the n⁻-type epitaxial layer 3 and a p⁺-type single crystal SiGe alloy film 10.

The p⁺-type polycrystalline silicon film 13, which is served as the third semiconductor region, is in contact with the surface of the p⁺-type polycrystalline SiGe alloy film 11. The opening provided in the silicon nitride film 9 has a side wall comprising the silicon oxide film 14 which is served as side wall insulating film, the emitter region 15 which is served as the fourth semiconductor region is formed by driving-in impurities from the polycrystalline silicon film 16 for an emitter electrode. All these components are covered by a silicon oxide film 17. An Al-based emitter electrode 18-1, an Al-based base electrode 18-2, and an Al-based collector electrode 18-3 are provided so as to contact with the polycrystalline silicon films for electrode 16, 7, and 8 respectively.

Next, the manufacturing method of the semiconductor device in accordance with the first embodiment of the invention is described herein under. The manufacturing method of the semiconductor device in accordance with the invention comprises basically a laminating step, opening step, second semiconductor region forming step, third semiconductor region forming step, side wall insulating film forming step, and fourth semiconductor region forming step. Detailed processing in each step is described herein under.

In the laminating step, the semiconductor films 7 and 8 is laminated and formed on the first semiconductor region 3 by covering with the insulating film 6.

In the opening step, the overhang opening is formed, which opening extends to the first semiconductor region 3 through the insulating film 6 and semiconductor films 7 and 8, and has an eaves of a partial area of the bottom surface of the semiconductor film 7.

In the second semiconductor region forming step, the second semiconductor region 10 and 11 is formed on the side wall of the opening.

In the third semiconductor region forming step, the third semiconductor region 12 and 13 is formed covering the first semiconductor region 3 and the second semiconductor region 10 and 11 in the opening.

In the side wall insulating film forming step, the side wall insulating film 14 is formed covering the side surface of the third semiconductor region 12 and 13.

In the fourth semiconductor region forming step, the fourth semiconductor region 15 is formed in contact with the third semiconductor region 12 and 13 surrounded by the side wall insulating film 14.

Next, the method in accordance with the first embodiment of the invention is described referring to FIG. 3(a)–FIG. 3(f).

Figure 3A:
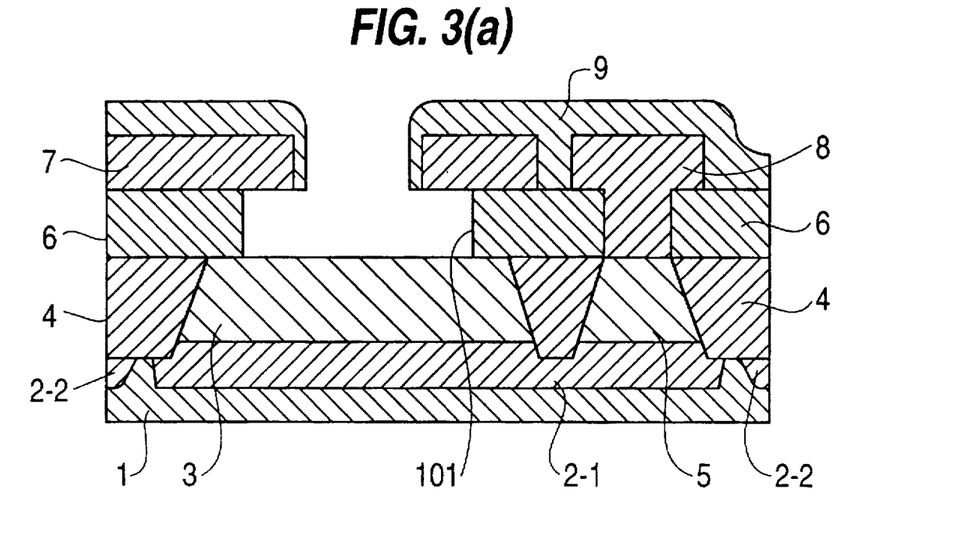
FIG. 3(a) to FIG. 3(f) are a set of cross-sectional views for illustrating the order of manufacturing steps for description of the manufacturing method of a semiconductor device of the first embodiment in accordance with the present invention.

A surface of p⁻-type silicon substrate 1 with (100) plane bearing and with a specific resistance of 10 to 20 Ω·cm is entirely oxidized to a depth of approximately 6000 Å. A photo-resist film is patterned on the oxide film by conventional lithograph technique, the SiO₂ film is selectively etched with HF-based etching solution using the photo-resist as a mask to remove partially the SiO₂ film where the SiO₂ film is not covered by the photo-resist film. Thereafter, the photo-resist film is removed.

To mitigate damage caused by ion implantation in the next step and to form a pattern for aligning in lithograph processes after the next step, the p⁻-type silicon substrate 1 on which SiO₂ patterning was applied is oxidized to a depth of approximately 500 Å. Then, As is ion-implanted to form selectively an n⁺-type buried layer 2-1 only on the area where SiO₂ film with a thickness of approximately 6000 Å had removed. For example, the ion implantation is carried out under a condition of 70 keV, $5 \times 10^{15}$ cm⁻², heat-treatment at 1100° C. for 3 hours after the ion implantation to eliminate damage due to ion implantation and to reduce collector resistance by diffusing the implanted arsenic. Then, SiO₂ film on the surface is removed entirely with HF-based etching solution. In the above-mentioned processing, ion implantation technique is used, however, the same n⁻-type buried layer is formed by heat-treatment to diffuse arsenic from a coating film containing arsenic in high concentration, and antimony may be used as the impurity.

A p⁺-type buried layer 2-2 for channel stopper is formed to prevent the p⁻-type silicon substrate 1 from forming an inversion layer at the area under the bottom surface of the selective oxide layer 4 formed for element separation. For example, the forming is carried out under a condition that the surface is oxidized to the depth of approximately 400 Å, a photo-resist film is remained on the desired area in lithography process, and boron is ion-implanted using the photo-resist as a mask. For example, the ion implantation is carried out under a condition of 110 keV, $1 \times 10^{14}$ cm⁻², followed by performing heat-treatment at 1000° C. for one hour in a nitrogen atmosphere.

Then, the surface oxide film is removed entirely with HF-based etching solution, thereafter, an n⁻-type epitaxial layer 3 is grown. SiH₄ or SiH₂Cl₂ is used as source gas and growing temperature is 1000° C. to 1100° C. PH₃ is used as doping gas. As described herein above, an epitaxial layer (the first semiconductor region) 3 is obtained, which layer has a region of a concentration $1 \times 10^{10}$ cm⁻³ with a thickness of approximately 0.7 micron and has the transition region from the surface to the buried layer of average n-type concentration of approximately $1 \times 10^{16}$ cm⁻³.

Then, SiO₂ film with a thickness of approximately 500 Å is formed on the surface, thereafter, a silicon nitride film with a thickness of 1000 Å is deposited by LPCVD method. The forming is carried out under a condition of 700° to 900° C. using a reaction gas of SiH₂Cl₂+NH₃. Then, a patterning to the nitride film is carried out by lithography processing, the silicon nitride film is selectively removed by dry etching using a resist as a mask material. The dry etching is brought to a stop when the surface layer of 100 to 200 Å of the SiO₂ film with a thickness of approximately 500 Å under the silicon nitride film is removed, thereby, the silicon nitride film is removed completely without damage on the under layer. The photo-resist film is removed. Then, a selective oxide film 4 is formed using the patterned silicon nitride film as a mask material. For example, the forming of the selective oxide film 4 is carried out under a condition of 1000° C. steam for four hours, in this case, an oxide film with a thickness of approximately 8000 Å is formed.

Then, the silicon nitride film used as mask material is removed completely by soaking it in a phosphoric acid (H₃PO₄) at approximately 130° C. Then, again a silicon oxide film 6 with a thickness of approximately 2000 Å serving as an interlayer insulating film is deposited on the surface of the epitaxial layer 3 and the selective oxide film 4. The silicon oxide film 6 is patterned on only the area of the silicon oxide layer where a collector electrode will be formed afterward by lithography and dry etching techniques in the same manner as used in the previous selective oxidation process. Then, a polycrystalline silicon film 7 for a base electrode with a thickness of approximately 2000 Å is deposited by LPCVD method. The deposition is carried out under a condition of approximately 620° C. using $SiH_4$ as a source material. The poly-silicon film is patterned by lithograph and dry etching, followed by removing a resist film.

Then, a photo-resist film is formed and patterned by lithography technique so as to have an opening only on the area of the polycrystalline silicon film 7 for a base electrode, and boron is ion-implanted under a condition of 20 keV and $5\times10^{15}$ $cm^{-3}$ using the resist as a mask, subsequently the resist is removed.

Then, a silicon oxide film with a thickness of 500 Å and silicon nitride film with a thickness of 1000 Å are deposited by CVD method in order, and the two-layered film made of the oxide and nitride films is opened only on the area of the polycrystalline silicon film 8 for a collector electrode by lithography and dry etching techniques. Then, it is subjected to a heat-treatment at 900° C. for 20 minutes in $POCl_3$ to diffuse phosphorus only into the opening area, thereby, phosphorus diffuses not only into the polycrystalline silicon layer 8 for a collector electrode but also into the under layer to form an $n^+$-type collector leading region 5. The silicon nitride and silicon oxide films of the upper two layers are removed using phosphoric acid and HF-based etching solution, respectively. Afterward, a silicon nitride film 9 with a thickness of approximately 1500 Å is entirely deposited by CVD method.

Then, photo-resist is coated to form a photo-resist film on the top surface of the silicon nitride film 9, and the photo-resist film is selectively removed by lithography technique to form an opening only in the area an emitter region will be formed. Then, the silicon nitride film 9 only exposed in the opening of the photo-resist film is removed by anisotropic dry etching technique using the photo-resist film as a mask. The dry etching is continued to open the polycrystalline silicon film 7, and subsequently the resist film is removed. Then, another silicon nitride film is entirely deposited by LPCVD method. For easy understanding of the figures, a figure in which the silicon nitride film 9 is contained in the lately deposited silicon nitride film is shown.

Then, the entire surface of silicon nitride film 9 is etched by anisotropic dry etching technique. Thereby, the top and side surfaces of the polycrystalline silicon film 7 are covered with the silicon nitride film 9 and the silicon oxide film 6 is exposed with a prescribed area at the opening area which is to be the emitter forming area.

Then, the silicon oxide film 6 is side-etched to remove a prescribed distance from the opening of the silicon nitride film 9 by wet etching technique using a HF-based solution. Thereby, only the area a base region will be formed on the top surface of the $n^-$-type silicon epitaxial layer 3 is exposed. The polycrystalline silicon film 7 for the base electrode is changed to a shape having a projection above the area for forming the base afterward. In this eaves structure, the bottom surface of the polycrystalline silicon film 7 for base electrode is exposed in the width of approximately 2000 Å. As described herein above, the structure shown in FIG. 3(a) is formed. Through the processes described herein above, the laminating step for laminating and forming the semiconductor films 7 and 8 on the first semiconductor region 3 by covering with the insulating film 6, and the opening step for forming the opening which extends to the first semiconductor region 3 through the insulating film 6 and semiconductor films 7 and 8 and has an overhang structure having an eaves of a part of the bottom surface of the semiconductor film 7 are completed.

Figure 3B:
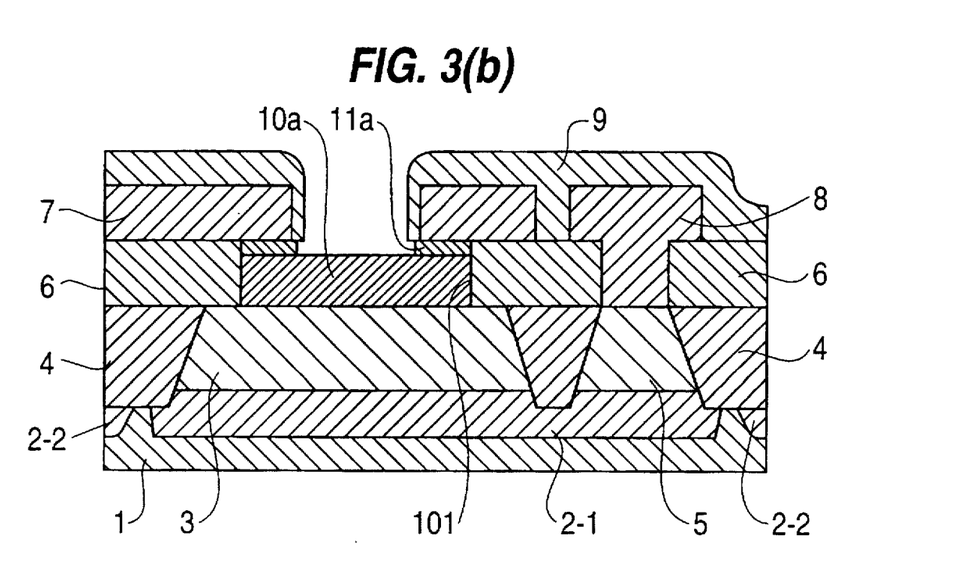

Then, as illustrated in FIG. 3(b), a $p^+$-type single crystal silicon germanium (SiGe) alloy film 10a is formed on the $n^-$-type epitaxial layer 3 exposed in the eaves structure and a $p^+$-type polycrystalline silicon germanium (SiGe) alloy film 11a is formed under a bottom surface of the $p^+$-type polycrystalline silicon film 7 for base electrode of the eaves structure. The grown $p^+$-type single crystal SiGe alloy film 10a is brought in contact with the grown $p^+$-type poly crystalline SiGe alloy film 11a. The selective growth technique to such special structure is described in detail in a literature which was proposed by the inventors of the present invention, namely, F. Sato et al., "A Super Self-Aligned Selectively Grown SiGe Base (SSSB) Bipolar Transistor Fabricated by Cold-Wall Type UHV/CVD Technology" IEEE Trans. Electron Devices, Vol. 41, No. 8, pp. 1373–1378 (1994). Herein, this process is described referring to UHV/CVD technology, however, other technologies such as MBE technology, LPCVD and AP (atmospheric pressure) CVD techniques are also applicable. In a Cold-Wall type UHV/CVD apparatus, a SiGe alloy film containing Ge in an content of 10% (namely $Si_{0.9}Ge_{0.1}$) is formed under a condition that the temperature of substrate is 605° C., flow rate of $Si_2H_6$ is 3 sccm, $GeH_4$ is 2 sccm, and $Cl_2$ is 0.03 sccm. In this case, the thickness of the $p^+$-type single crystal SiGe film 10a is approximately 1700 Å and the thickness of the $p^+$-type polycrystalline SiGe film 11a is approximately 400 Å. In the figure not shown clearly, the thickness of the $p^+$-type single crystal SiGe alloy film 10a is slightly thicker in the area where the $p^+$-type single crystal SiGe alloy film 10a is not in contact with the $p^+$-type polycrystalline SiGe alloy film 11a because the growing is continued for a while after the both films are joined. The $p^+$-type single crystal SiGe alloy film 10a and $p^+$-type polycrystalline SiGe alloy film 11a are doped with boron by feeding $B_2H_6$ during the growing. In this case, the boron concentration doped in both films is approximately $4\times10^{19}$ $cm^{-3}$.

Figure 3C:
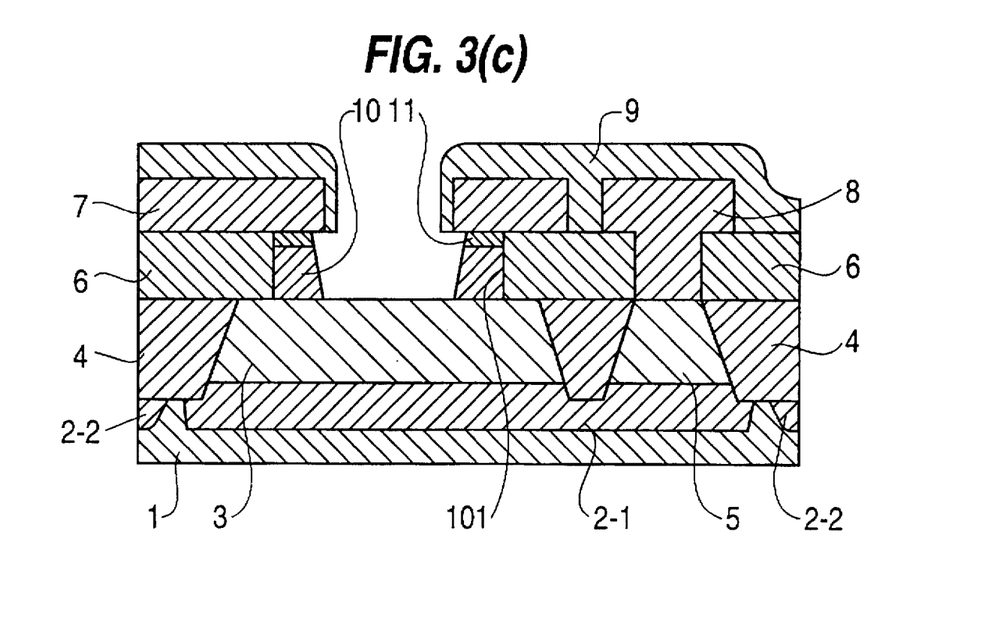

Then, as shown in FIG. 3(c), only the partial area of the $p^+$-type single crystal SiGe alloy film 10a just exposed in the opening of the silicon nitride film 9 is removed to form the $p^+$-type single crystal SiGe alloy film 10, and $p^+$-type polycrystalline SiGe alloy film 11 which are served as the second semiconductor region. The removal is carried out under a condition that etching speed of a SiGe alloy film is higher than that of a silicon film. Though various conditions are available for such etching, herein, a condition is described for a case that, after the completion of forming of the $p^+$-type single and polycrystalline SiGe alloy films 10a and 11a in the UHV/CVD apparatus, the partially fabricated device are not taken out from the apparatus and is subjected to the selective etching continuously.

For example, the etching is carried out under a condition that the temperature of the substrate is approximately 710° C. and $Cl_2$ flow rate is 0.05 sccm. Under this condition, the ratio of $Si_{0.9}Ge_{0.1}$ etch rate to Si etch rate is approximately 30. If the substrate temperature is raised higher, the selectivity ratio of etch rate decreases. To the contrary, if the substrate temperature is lowered, etching scarcely occurs.

The method of successive processing of the growth and etching in the same apparatus is advantageous in that the preliminary treatment prior to the next growing step of an intrinsic base region is needless. However, a method in which the etching step is carried out in a different apparatus is also possible in principle, and the method is included in the scope of the present invention. When the above-mentioned process is finished, the second semiconductor region forming step for forming the second semiconductor region 10 and 11 on the side wall of the overhang structured opening formed in the above-mentioned opening step is completed.

Figure 3D:
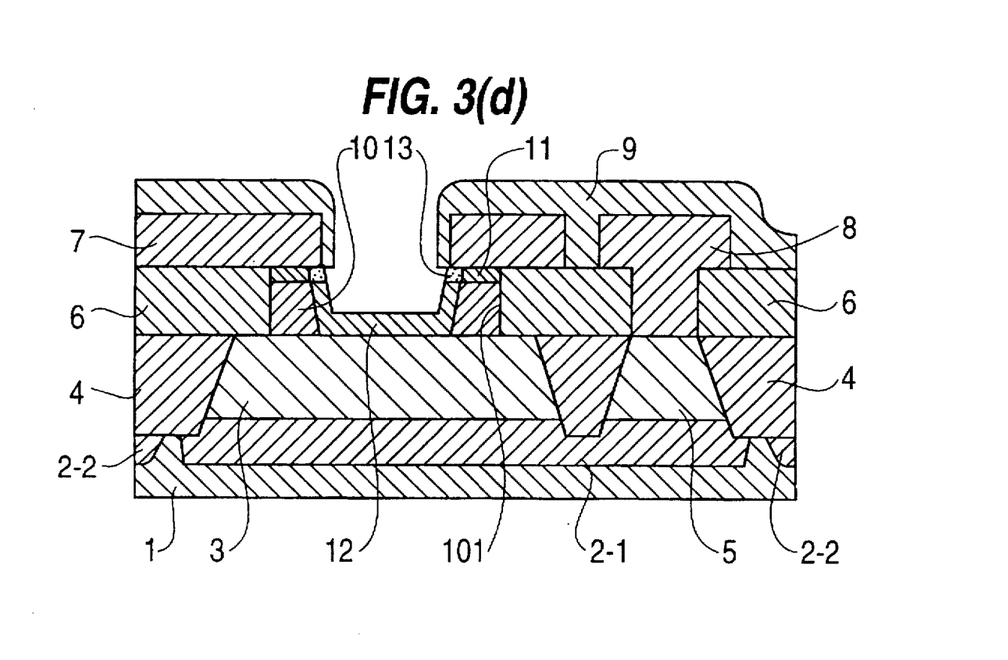

Then, as illustrated in FIG. 3(d), a p⁺-type single crystal silicon intrinsic base layer (the third semiconductor region) 12 with a thickness of approximately 600 Å and with a boron concentration of approximately 6×10¹⁸ cm⁻³ is formed on exposed surfaces of the epitaxial layer 3 and the SiGe alloy films 10a in the same UHV/CVD apparatus. Then, a p⁺-type polycrystalline silicon film (the third semiconductor region) 13 is formed in contact with the p⁺-type polycrystalline SiGe alloy film 11 simultaneously. When the above-mentioned process is finished, the third semiconductor region forming step for forming the third semiconductor region 12 and 13 in the above-mentioned overhang structured opening covering the first semiconductor region 3 and the second semiconductor region 10 and 11 is completed.

Figure 3E:
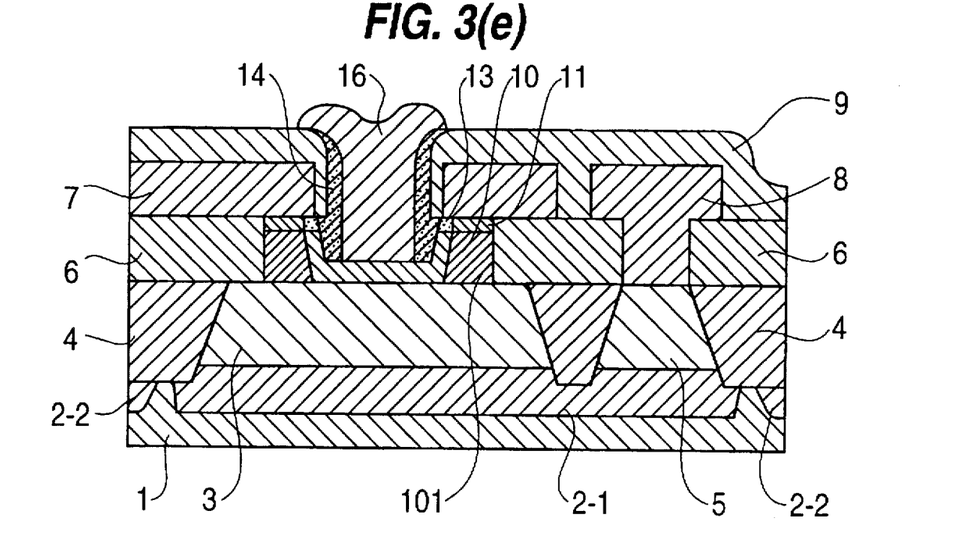

Then, as illustrated in FIG. 3(e), a silicon oxide film is deposited covering the top surface of the silicon nitride film 9 and the opening area of the silicon nitride film 9 by LPCVD technique followed by etching back, thereby, a silicon oxide film 14 which is served as a side wall insulating film is formed on the inside of the opening of the silicon nitride film 9. When the above-mentioned process is finished, the side wall insulating film forming step for forming the side wall insulating film 14 covering the side surface of the third semiconductor region 12 and 13 is completed.

A polycrystalline silicon film containing n-type impurity (for example arsenic or phosphorus) in a concentration of approximately 1×10²⁰ to 5×10²¹ cm⁻³ is deposited on the silicon nitride film 9 and silicon oxide film 14 to fill a space surrounded by the side wall insulating film 14. An n⁺-type polycrystalline silicon film 16 for an emitter electrode (the fourth semiconductor region) to be in contact with the silicon oxide film 14 in the opening of the silicon nitride film 9 is formed from the silicon film by photo-lithography technique and dry etching technique. When the above-mentioned process is finished, the fourth semiconductor region forming step for forming the fourth semiconductor region 15 in contact with the third semiconductor region 12 and 13 surrounded by the side wall insulating film 14 is completed.

Figure 3F:
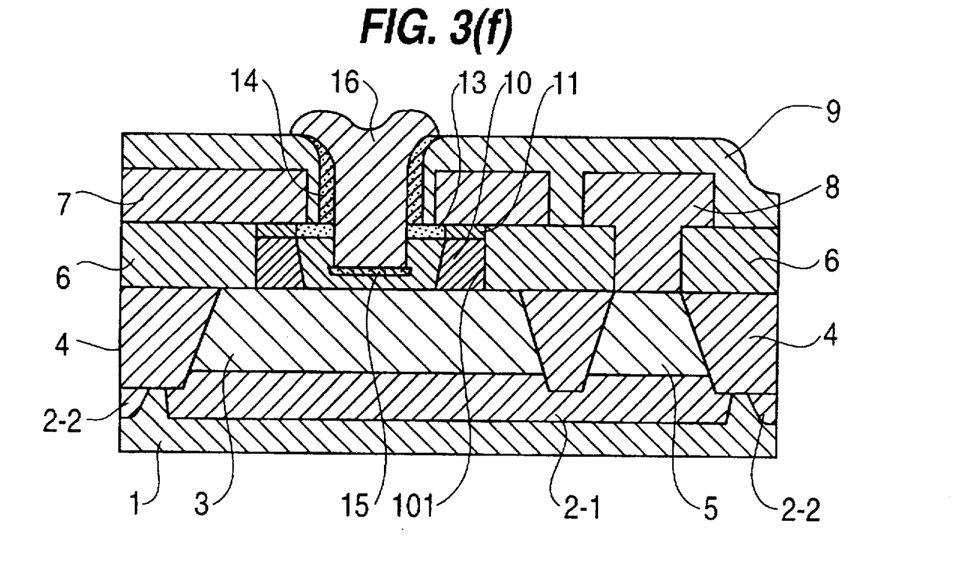

Then, as illustrated in FIG. 3(f), an n⁺-type emitter region 15 is formed under the n⁺-type polycrystalline silicon film 16 by rapid thermal annealing (RTA) under a condition of, for example, 950° C. for 5 seconds. As illustrated in FIG. 2, a top surface is covered with a silicon oxide film 17, then, openings are formed in the silicon oxide film 17 for contact with polycrystalline silicon films for electrode 16, 7, and 8 individually. An Al-based emitter electrode 18-1, Al-based base electrode 18-2, and Al-based collector electrode 18-3 are provided for connecting with the n⁺-type polycrystalline silicon film 16 for the emitter electrode, the p⁺-type polycrystalline silicon film 7 for the base electrode, and the n⁺-type polycrystalline silicon film 8 for the collector electrode, respectively.

In the first embodiment, the embodiment is described referring to the p⁺-type single crystal SiGe alloy film 10 in which the Ge concentration is made constant in the depth direction, otherwise, in the case of retro-grade Ge profile, namely a profile in which the Ge concentration increases in the depth direction toward the substrate 1, the etching is stopped also at the boundary of the SiGe alloy films 10a and Si epitaxial layer 3.

Figure 4:
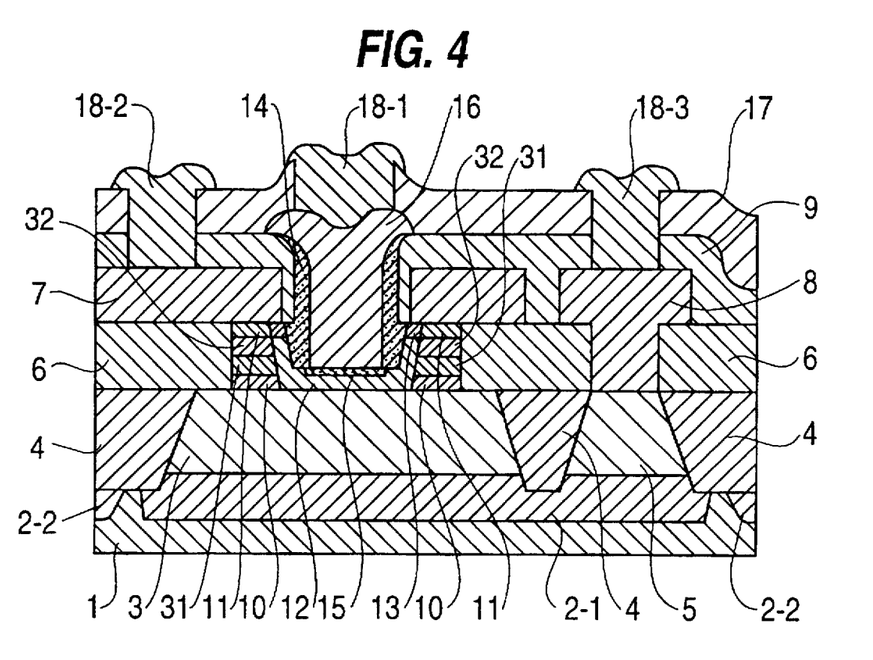
FIG. 4 is a cross-sectional view of a semiconductor device for describing the second embodiment in accordance with the present invention.

Next, the second embodiment of the present invention is described referring to FIG. 4. The second embodiment is different from the first embodiment in that for forming eaves structure (FIG. 3(a)), a p⁺-type single crystal SiGe alloy film 10a and p⁺-type single crystal Si film 31a (not shown in the figure) are grown in the order. That is, single crystal SiGe alloy film 10a and polycrystalline SiGe film 11a are formed thinly on a surface of the epitaxial layer 3 and a bottom surface of the polycrystalline silicon film 7, respectively. The both SiGe film 10a and 11a are not connected each other in this time. Then, a single Si film 31a and a polycrystalline Si film 32a are formed between the SiGe film 10a and 11a to connect each other, respectively, thereby connecting the SiGe film 10a and 11a each other via the single Si film 31a and the polycrystalline Si film 32a. Then, selective etching the single crystal SiGe alloy film 10a and the single crystal Si film 31a against epitaxial layer 3 to form a p⁺-type single crystal SiGe alloy film 10 and p⁺-type single crystal Si film 31. Therefore, a p⁺-type single crystal SiGe alloy film 10, p⁺-type single crystal silicon film 31, p⁺-type polycrystalline silicon film 32, and p⁺-type polycrystalline SiGe alloy film 11a, which serve as the second semiconductor region, are formed under the eaves area in the order from the bottom by SiGe/Si selective etching. This structure allows the film thickness of the SiGe alloy films 10 and 11 to be thinner than that in the first embodiment, the generation of defects during the process due to the difference in lattice constant between a SiGe base region and a Si collector region and a leak current at the base-collector junction is reduced comparing to the first embodiment.

Figure 5:
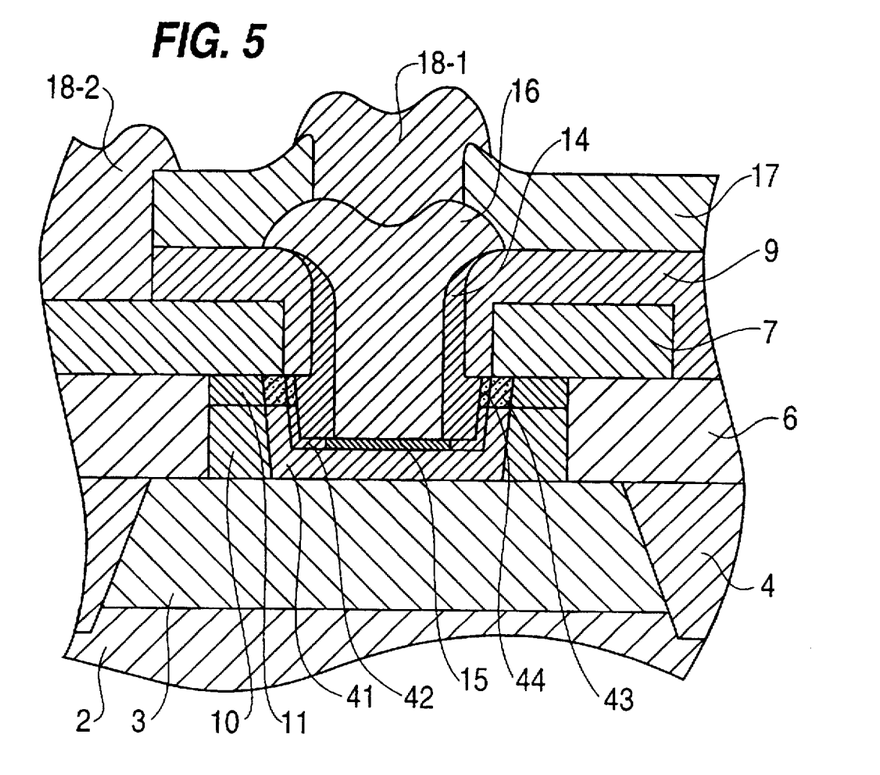
FIG. 5 is a cross-sectional view of a semiconductor device for describing the third embodiment in accordance with the present invention.

Next, the third embodiment of the present invention is described referring to FIG. 5. Details of other areas are the same as those of the first and second embodiments. This embodiment allows the transistor to be improved in performance because the intrinsic base area is made of SiGe alloy. In detail, a p-type single crystal SiGe alloy film 41 for an intrinsic base region, a p⁺-type single crystal silicon film 42, and a p⁺-type polycrystalline silicon film 44 which are served as the third semiconducting region are formed. That is, the single crystal silicon film 42 is formed between the singly crystal SiGe alloy film 41 and the polycrystalline silicon film 16. Moreover, an n-type emitter region is formed in the single crystal silicon film 42. The Ge concentration in the SiGe alloy film 41 may be constant, otherwise, may be retro-grade (Ge concentration increases in the depth direction toward the epitaxial layer 3). Such Ge profile possibly results in the improved $h_{FE}$ and $f_T$. In one example of the profile, Ge concentration increases uniformly from 0% to 10% in the depth direction in the p⁺-type single crystal SiGe alloy film 41 for an intrinsic base region, boron concentration is constant at approximately 8×10¹⁸ cm⁻³, and the thickness is approximately 400 Å on the area just under the opening of the silicon nitride film 9. For the p⁺-type single crystal silicon film 42, the boron concentration is approximately 1×10¹⁸ cm⁻³, and the thickness is approximately 250 Å on the area just under the opening. The p⁺-type single crystal silicon film 42 is formed as described herein above, thereby, the emitter/base junction is formed as a heterojunction, thus, the current amplification factor $h_{FE}$ is further improved advantageously.

Figure 6:
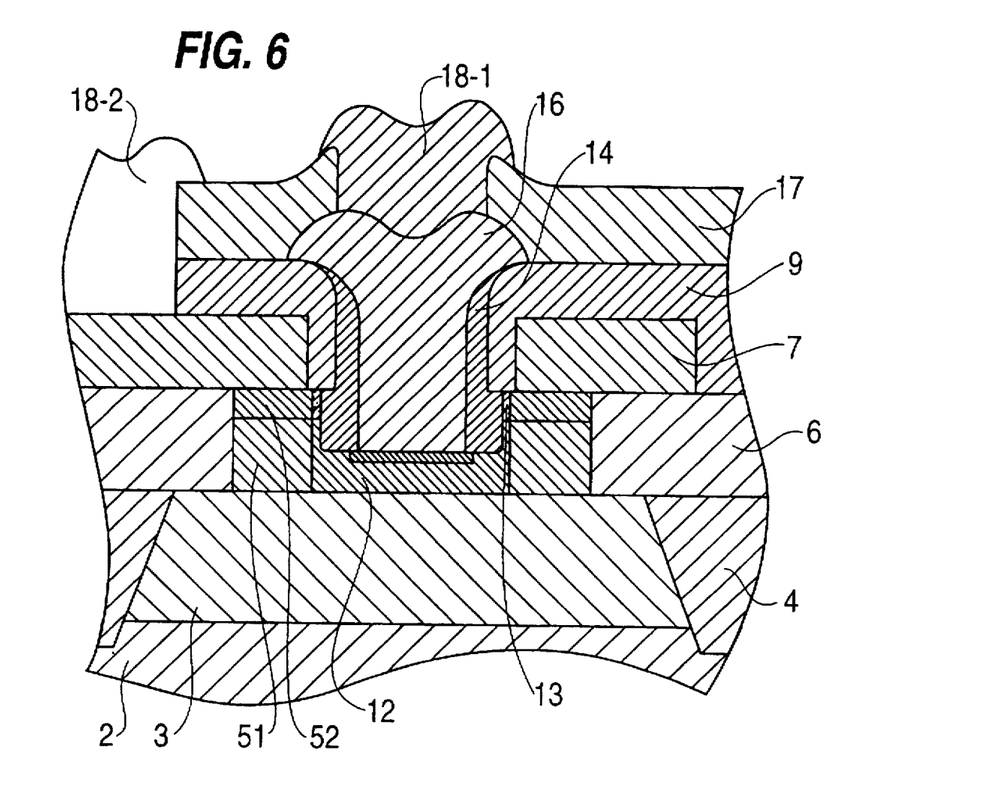
FIG. 6 is a cross-sectional view of a semiconductor device for describing the fourth embodiment in accordance with the present invention.

Next, the fourth embodiment of the present invention is described referring to FIG. 6. Details of other areas are the same as those of the first and second embodiments. This embodiment illustrated in FIG. 6 is unique in that the p⁺-type single crystal SiGe alloy film 51 and p⁺-type polycrystalline SiGe alloy film 52 are not side-etched in the etching for leaving SiGe under the eaves structure. That is, the polycrystalline silicon film 13 is not directly contact with the polycrystalline silicon film 7 serving as a base electrode. This structure results in reduced base resistance effectively.

As described hereinbefore, according to the present invention, in the manufacturing process of a self-aligned type bipolar transistor the base of which transistor is formed by selective epitaxial technology, to form an area for connecting a polycrystalline silicon film for base electrode with an intrinsic base region, the method that SiGe is selectively grown and the SiGe is subjected to SiGe/Si selective dry etching is applied to leave SiGe on only desired area, thus, the base resistance is reduced and the parasitic capacitance between base and collector is effectively reduced. The narrower band gap of the third semiconductor region than that of the first and fourth semiconductor region results in increased current amplifying factor. The band gap of the third semiconductor is designed in the shape that the band gap is formed wider gradually as the portion of the band gap is farther from the first semiconductor region, thereby, an electric field which accelerates the running of minority carrier passing through the base is generated, the electric field results in the shortened base running time, and the high speed operation is realized.

What is claimed is:

1. A method for manufacturing a semiconductor device comprising the steps of:

forming a collector layer of a first conductivity type on a semiconductor substrate;

forming an insulating layer having an opening for exposing said collector layer on said semiconductor substrate;

forming a base electrode including an end, wherein the end projects to said opening on said insulating layer;

growing a first semiconductor layer of a second conductive type on said collector layer and a second semiconductor layer of the second conductive type between said first semiconductor layer and said end of said base electrode, thereby electrically connecting said first semiconductor layer and said second semiconductor layer in said opening;

selectively removing said first semiconductor layer to expose said collector layer, thereby a remaining portion of said first semiconductor layer serving as an outer base layer;

forming an inner base layer of said second conductivity type to cover said collector layer and said outer base layer and said second semiconductor layer; and forming an emitter layer of said first conductivity type on said inner base layer.

2. The method for manufacturing a semiconductor device as claimed in claim 1, wherein semiconductor materials of said collector layer and said first semiconductor layer are selected so that the combination of the materials has the same etching selectivity.

3. The method for manufacturing a semiconductor device as claimed in claim 1, wherein said collector layer is made of silicon and said first semiconductor layer is made of silicon germanium.

4. The method for manufacturing a semiconductor device as claimed in claim 1, wherein said inner base layer is made of a material selected from a group consisting of silicon or silicon germanium.

5. The method for manufacturing a semiconductor device as claimed in claim 1, wherein after forming of said first and second semiconductor layer, the third and fourth semiconductor layers are grown on the surface of said first and second semiconductor layers, respectively, to connect electrically said first and second semiconductor layers through said third and fourth semiconductor layers.

6. The method for manufacturing a semiconductor device as claimed in claim 1, wherein said inner base layer is made of silicon germanium and said emitter layer is made of silicon.

7. The method for manufacturing a semiconductor device as claimed in claim 1, wherein a gas including chlorine is used to selectively remove said first semiconductor layer.

8. The method for manufacturing a semiconductor device as claimed in claim 7, wherein the steps of growing said first semiconductor layer and said second semiconductor layer, and selectively removing said first semiconductor layer and said second semiconductor layer, are successively carried out in an apparatus.

9. The method for manufacturing a semiconductor device as claimed in claim 7, wherein a temperature of said semiconductor substrate is approximately 710 C.

10. The method for manufacturing a semiconductor device as claimed in claim 1, wherein a side wall is formed on an inside wall of said opening after said inner base layer is formed and before said emitter layer is formed.

* * * * *